United States Patent [19]

Quinn

[11] 4,427,758

[45] Jan. 24, 1984

[54] SINGLE EXPOSURE POSITIVE-WORKING PHOTOPOLYMER ELEMENT

[75] Inventor: John A. Quinn, Morganville, N.J.

[73] Assignee: E. I. Du Pont de Nemours and Co., Wilmington, Del.

[21] Appl. No.: 307,648

[22] Filed: Oct. 1, 1981

[51] Int. Cl.³ .................................................. G03C 1/78
[52] U.S. Cl. .................................... 430/271; 430/270; 430/281; 430/288; 430/296; 430/329
[58] Field of Search ............... 430/329, 296, 275, 281, 430/271, 270

[56] References Cited

U.S. PATENT DOCUMENTS 4,229,517 10/1980 Bratt et al. .................... 430/271
4,268,601 5/1981 Namiki et al. ................ 430/271

*Primary Examiner*—Jack P. Brammer

[57] ABSTRACT

A high speed, positive-working photopolymer element comprising, in order: (1) a support, (2) a nonphotosensitive layer comprising a hardenable binder (e.g., gelatin) containing a releasable hardener (e.g., glutaraldehyde-bisulfite), and an optional colorant, and (3) a permeable photopolymerizable layer. Imagewise exposure of the photopolymerizable layer is followed by diffusion of an alkali through the nonimage area, releasing the hardener. A subsequent wash-off step produces a positive image of the original.

5 Claims, 4 Drawing Figures

SINGLE EXPOSURE POSITIVE-WORKING PHOTOPOLYMER ELEMENT

TECHNICAL FIELD

This invention relates to a low cost, single exposure, aqueous processable, positive-working photopolymer element with excellent image quality suitable for use in electronic imaging, for example, and to a novel imaging process.

BACKGROUND ART

In the electronic imaging field there is a need for convenient and cheap imaging systems. Conventionally, these needs have been met by photosystems employing silver halide as the photosensitive element. With the increasing silver prices, there is need for lower cost systems. Photopolymer elements are now being evaluated in this field. Although photopolymers can be used to produce a satisfactory image, they are conventionally many orders of magnitude slower than representative silver halide elements and are usually negative-working. If positive working, it often requires two exposures. There is a pressing need for a cheap, single exposure, positive-working photopolymer element that can be processed in aqueous solutions to satisfy the needs of the electronic imaging field for example.

BRIEF DESCRIPTION OF THE DRAWING

The invention is illustrated schematically in FIGS. 1-4.

SUMMARY OF THE INVENTION

The needs and objects of this invention can be met by providing a positive-working photopolymer element consisting essentially of a support, on one side of which is coated, in order, (1) a nonphotosensitive layer comprising a hardenable binder having a releasable hardening agent mixed therein, and (2) a permeable photopolymerizable layer.

In an illustrative embodiment the invention is directed to a single exposure positive-working dual layer photopolymer element consisting essentially of a support, an opaque, nonphotoactive layer comprising carbon black, gelatin and glutaraldehyde bisulfite (GDA-HSO$_3$) on said support, and a photopolymerizable layer coated contiguous thereto. After imagewise exposure of the photopolymerizable layer, the photopolymer element is treated with an aqueous developer solution containing K$_2$CO$_3$/KHCO$_3$. This solution preferentially diffuses through the unexposed regions of the photopolymerizable layer to the opaque layer, releasing glutaraldehyde, which vary rapidly hardens the surrounding gelatin. The entire photopolymerizable layer and the unhardened portions of the opaque layer are then removed by washing, leaving a direct positive image of the original.

DETAILED DESCRIPTION OF THE INVENTION

It is known that glutaraldehyde will very rapidly harden gelatin, particularly at high pH, but because of its volatility, mobility and reactivity, glutaraldehyde itself would be undesirable in a photographic system. However, it reacts with sodium bisulfite to form a stable, crystalline, water-soluble addition product. In the presence of carbonate, this reaction is reversed, liberating free glutaraldehyde.

The two-layer structure of the present invention, with a photopolymerizable layer coated on top of a gelatin layer that contains glutaraldehyde-sodium bisulfite together with a colorant such as carbon black, is based on this reaction mechanism. But the same principle can be applied to analogous reactants, as will be further explained.

Figure 1:
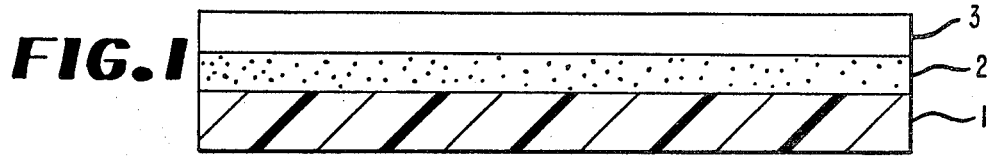
FIG. 1 is a schematic cross-sectional view of the single exposure positive-working photopolymer element of the invention.

Referring to the drawings, FIG. 1 shows the positive-working photopolymer element of this invention prior to exposure wherein support 1 is coated with nonphotosensitive layer 2 comprised of a hardenable binder containing a releasable hardening agent, and a top layer 3 which is the permeable photopolymerizable layer, i.e., the imaging layer.

Figure 2:
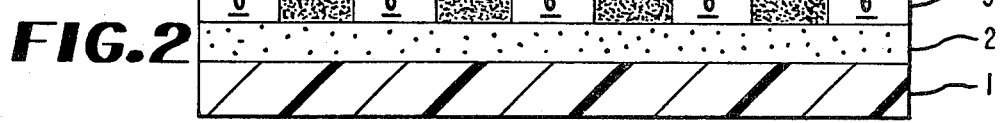
FIGS. 2 and 3 illustrate in section and schematically the exposure and development of the photopolymer element of FIG. 1.

In FIG. 2, the element is being exposed by actinic radiation 4 and 4a through an image 5. Rays 4 are prevented from striking the photopolymerizable layer 3 while rays 4a strike said layer, causing photopolymerization in exposed areas 7. Areas 6 are unexposed, and unpolymerized, and therefore remain permeable.

Figure 3:
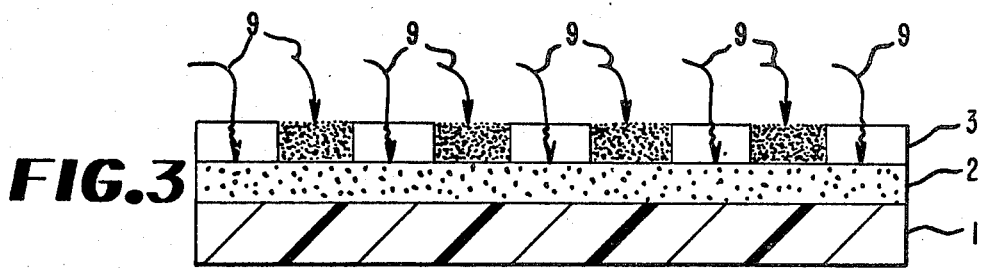

FIG. 3 shows development by contacting the exposed element with a developer liquid 9 which permeates through the unpolymerized areas 6 and causes the hardening agent in the underlying areas of layer 2 to be released, hardening the binder in those areas.

Figure 4:
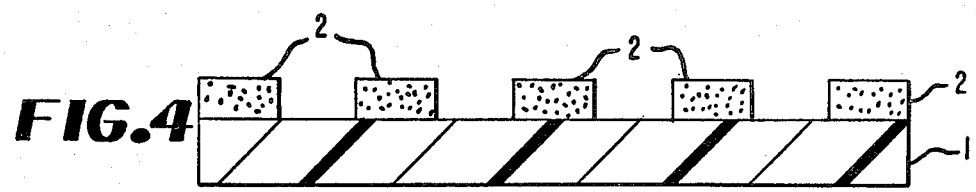
FIG. 4 illustrates a schematic cross-section of a finished, direct positive image made by the exposure/development sequence of FIGS. 2-3.

FIG. 4 shows the final, positive image obtained after wash-out of the unhardened areas of layer 2, with the simultaneous removal of all of layer 3, if desired.

In a preferred embodiment the support 1 is CRONAR polyester, a trademark of E. I. du Pont de Nemours and Company, Wilmington, Del. for a flexible transparent polyethylene terephthalate film, which in this case is suitably subbed (subcoated); the nonphotosensitive layer 2 is gelatin containing carbon black as a colorant for producing a visible image and glutaraldehyde-sodium bisulfite as the releasable hardener; and the permeable photopolymerizable layer 3 is the negative-working system described in Bratt et al, "Dot-Etchable Photopolymerizable Elements", U.S. Pat. No. 4,229,517, Example 1. An optional cover sheet may be coated or laminated to photopolymerizable layer 3 to protect it and to prevent oxygen inhibition. An imagewise exposure of this layer 3 to an exposure source rich in ultraviolet radiation will produce image areas 7 of polymerized material in the region struck by this radiation. When contacted with developer 9, e.g., aqueous Na$_2$CO$_3$, these areas will act as a diffusion resist, i.e., will be slow to diffuse developing agent 9. However, the unexposed and unpolymerized areas 6 will diffuse the developer rapidly into the underlying areas of layer 2, releasing the hardener in these areas and causing crosslinking of the gelatin. The noncrosslinked areas can then be washed out with warm water, along with the imaging layer 3, leaving a colored, positive image on the support.

Suitable supports may be chosen from a wide variety of films composed of high polymers, e.g., polyamides, polyolefins, polyesters, vinyl polymers and cellulosic esters having a variety of thickeners. Also useful are metal foils, papers and the like. The choice of support is not vital to this invention although polyethylene terephthalate, suitably subbed to receive the nonphotosensitive layer, is preferred.

The nonphotosensitive layer is comprised of a hardenable binder which may be gelatin (preferred) or such materials as polyvinyl alcohol (PVA), carbamated PVA, polyacrylamide, polyethylene imine, carboxymethyl cellulose (CMC), hydroxyethyl cellulose (HEC) or mixtures with CMC, etc. Releasable hardeners compatible with the hardenable binder must be selected. For example, glutaraldehyde-sodium bisulfite is particularly efficacious with gelatin and PVA as well as polyacrylamides and polyethylene imine.

Other hardeners of gelatin include, for example, glyoxal-sodium bisulfite, formaldehyde-sodium bisulfite, and starch dialdehyde-sodium bisulfite (or other alkali metal salts of the above). The organic titanates sold by E. I. du Pont de Nemours and Company, Wilmington, DE as TYZOR, for example, can be used as releasable hardeners for CMC as can the salts of $Cr^{+3}$. One must also balance the releasing developer solutions with the releasable hardener used so as to get the full effect of this invention. Most of these solutions are aqueous alkalis such as $Na_2CO_3$ (sodium carbonate), KOH, NaOH, etc. Other adjuvants may be present to help wash out the unhardened portion of this layer and to assist in finally removing all the image-forming photopolymerizable layer if desired.

A variety of colorants, i.e., pigments and dyes, may be added to the nonphotosensitive layer to provide image coloring if desired. Carbon black (colloidal carbon) is preferred but other materials such as iron oxide may also be used effectively. They must be compatible with the hardenable binder, however.

Examples of ultraviolet dyes, ultraviolet absorbers, and other dyes which can be used in this invention are listed below:

2,2'-dihydroxy-4-methoxy-benzophenone
4-dodecyloxy-2-hydroxybenzophenone
2,4-dihydroxybenzophenone
hydroxyphenylbenzotriazole
2(2'-hydroxy-5'-methoxyphenyl)benzotriazole
resorcinol-monobenzoate
2-hydroxy-4-methoxybenzophenone
2,2'-dihydroxy-4,4'-dimethoxy-benzophenone
2,2',4'-tetrahydroxybenzophenone
2-hydroxy-4-methoxy-benzophenone-5-sulfonic acid
   (also sodium salt of above)
ethyl-2-cyano-3,3-diphenylacrylate
2-ethylhexyl-2-cyano-3,3-diphenylacrylate

| | |
|---|---|
| LUXOL ® ORANGE GRL | Color Index #25 (Solvent Orange) |
| LUXOL ® ORANGE GS | Color Index #24 (Solvent Orange) |
| LUXOL ® ORANGE R | Color Index #20 (Solvent Orange) |
| PLASTO ® ORANGE M | Color Index #21 (Solvent Orange) |
| PLASTO ® ORANGE RS GRASOL | Color Index #22 (Solvent Orange) |
| Fast Orange 2RN | Color Index #33 (Solvent Orange) |
| Oil Orange | Color Index #12055 (Solvent Yellow #14) |
| Sudan Orange RA | Color Index #12055 (Solvent Yellow #14) |
| LUXOL YELLOW G | Color Index #45 (Solvent Yellow) |
| LUXOL YELLOW T | Color Index #47 (Solvent Yellow) |
| PLASTO YELLOW GR | Color Index #39 (Solvent Yellow) |
| PLASTO YELLOW MGS | Color Index #40 (Solvent Yellow) |
| OIL YELLOW 3G | Color Index #29 (Solvent Yellow) |
| SUDAN YELLOW | Color Index #30 (Solvent Yellow) |
| LUXOL FAST BLUE AR | Color Index #37 (Solvent Blue) |
| LUXOL FAST BLACK L | Color Index #17 (Solvent Black) |
| Primrose Yellow | Color Index #77603 (Pigment) |
| Chrome Yellow Light | Color Index #77603 (Pigment) |
| Chrome Yellow Medium | Color Index 77600 (Pigment) |
| Dispersed Manganese Dioxide | |
| Toluidine Yellow GW | Color Index #71680 (Pigment) |
| Molybdate Orange | Color Index #77605 (Pigment) |
| Dalamar Yellow | Color Index #11741 (Pigment) |
| Green Gold | Color Index #12775 (Pigment) |
| Graphtol Yellow | Color Index Pigment Yellow #61 |
| Graphtol Orange | Color Index Pigment Orange #13 |

To obtain an optical density in a thin layer of at least 3.0 throughout the 350 to 400 nm region frequently requires a high percentage of dyes and/or pigments, usually between 15–40% by weight, of the hardenable binder layer.

In photopolymerizable compositions the molecular weight of at least one component of the composition is increased by exposure to actinic radiation, causing a change in the rheological and thermal properties of the exposed areas and rendering the exposed areas relatively less soluble in solvents than the unexposed areas, thereby producing a solvent-developable image. Photopolymerizable compositions for use in the invention usually comprise a photoinitiator, an actinic radiation absorber to opacify layer 2 in the actinic region of the spectrum, a photopolymerizable monomer, and a polymeric binder, as described further below.

The photopolymerizable composition contains an organic, free-radical generating system activatable by actinic radiation, i.e., 300 nm and above, which initiates polymerization of the ethylenically unsaturated compound and does not subsequently terminate the reaction. The free-radical generating system should have at least one component that has an active radiation absorption band with a molar extinction coefficient of at least about 50 within the range of about 300 to 500 nm. "Active radiation absorption band" means a band of radiation which is active to produce the free radical necessary to initiate the polymerization. The free-radical generating system can comprise one or more compounds which directly furnish free radicals when activated by radiation. It can also comprise a plurality of compounds, one of which yields free radicals after having been caused to do so by a sensitizer which is activated by the radiation.

Photoinitiators which can be utilized in the practice of this invention include aromatic ketones such as benzophenone, Michler's ketone (4,4'-bis(dimethylamino)-benzophenone), 4,4'-bis(diethylamino)benzophenone, 4-methoxy-4'-dimethylamino-benzophenone, 2-ethylanthraquinone, phenathraquinone, and other aromatic ketones; benzoin, benzoin esters such as benzoin methyl ether, benzoin ethyl ether and benzoin phenyl ether, methylbenzoin, ethylbenzoin and other benzoins; and 2,4,5-triarylimidazole dimers such as 2-(o-chlorophenyl)-4,5-diphenylimidazole dimer, 2-(o-chlorophenyl)-4,5-(m-methoxyphenyl)imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer, 2,4-di(p-methoxyphenyl)-5-phenylimidazole dimer, 2-(2,4-dimethoxyphenyl)-4,5-diphenylimidazole dimer, 2-(p- methylmercaptophenyl)-4,4-diphenylimidazole dimer, and the like disclosed in U.S. Pat. No. 3,479,185, in British Pat. No. 1,047,569 (published 1966), and U.S. Pat. No. 3,784,557.

Particularly useful initiators are the 2,4,5-triarylimidazole dimers (also known as hexaarylbiimidazoles). These are used with a free-radical producing electron donor agent, such as 2-mercaptobenzoxazole, leuco crystal violet or tri(4-diethylamino-2-methylphenyl)-methane. Such sensitizers as Michler's ketone may be added. Various energy transfer dyes, such as Rose Bengal and Eosin Y, can also be used. Additional examples of suitable initiators are disclosed in U.S. Pat. No. 2,760,863. Other useful systems employ a triarylimidazole dimer and a free radical producing electron donor agent, with or without the use of a sensitizing compound as described in U.S. Pat. No. 3,479,185. Another useful group of initiators is those mixtures described in U.S. Pat. No. 3,427,161.

The free-radical generating system is employed in a concentration sufficient to initiate polymerization, which is usually about 0.1-25% by weight based on total composition, and preferably about 2 to 20% by weight.

The instant invention is not limited to the use of any particular polymerizable monomer, it being required only that the monomer be ethylenically unsaturated and capable of addition polymerization. A large number of useful monomers is available, generally characterized by one or more terminal ethylenic groups. Among the suitable monomers may be mentioned various vinyl and vinylidene monomers, e.g., vinyl carboxylates, alpha-alkyl acrylates, alpha-substituted acrylic acids and esters thereof, vinyl ester, vinyl hydrocarbons, acrylic and alpha-substituted acrylic acid esters of the polymethylene glycols and ether alcohols, all as disclosed in U.S. Pat. No. 2,760,863 and 2,971,504; the various compounds disclosed in U.S. Pat. No. 2,927,022 and especially those having a plurality of addition-polymerization ethylene linkages, particularly when present as terminal linkages, and more especially those wherein at least one and preferably most of such linkages are conjugated with a doubly bonded carbon, including carbon doubly bonded to carbon or to such hetero-atoms as nitrogen, oxygen and sulfur; esters of pentaerythritol compounds of the kind disclosed in U.S. Pat. No. 3,261,686; and compounds of the kind described in U.S. Pat. No. 3,380,831; e.g., the reaction product of trimethylolpropane, ethylene oxide, and acrylic and methacrylic acids.

The concentration of the monomer or monomers employed is normally about 7.5-35% by weight based on the total solids of the composition, and preferably between 15-25%.

The binder used in the photopolymer layer is an organic polymeric material that is preferably solid at 50° C., and it is necessary that the binder be compatible with the polymerizable monomer and the polymerization initiator system. It is frequently desirable, but it is not required, that the binder be thermoplastic. The binder may be of the same general type as the polymerizable monomer being used and may be soluble therein and plasticized thereby.

A wide variety of suitable binders, both thermoplastic and nonthermoplastic, is disclosed in U.S. Pat. No. 3,060,023, e.g., cellulose ethers or esters; polyalkylene ethers; condensation polymers of glycols with dibasic acids; polymers and copolymers of vinyl esters; acrylic acids and esters; polyvinyl alcohol; cellulose; phenolic resins; and the like. Other binders, including a number of vinylidene polymers are disclosed in U.S. Pat. Nos. 2,760,863 and 2,791,504. Still other useful binders are the N-methoxymethyl polyhexamethylene adipamide mixtures of British Pat. No. 826,272, the polyester, polyacetal or mixed polyesteracetal mixtures of U.S. Pat. Nos. 2,892,716; the fusible polyvinyl alcohol derivatives of 2,902,365; the fusible blends of selected organic-soluble cellulose derivatives of U.S. Pat. No. 2,902,365; the fusible blends of selected organic-soluble, base-soluble cellulose derivatives of U.S. Pat. No. 2,927,022; the polyvinyl acetals having extralinear vinylidene groups of U.S. Pat. No. 2,902,710; the linear polyamides containing extralinear N-acrylyloxymethyl groups of U.S. Pat. No. 2,972,540; and the 1,3-butadienes of U.S. Pat. No. 3,024,180.

The binder or binder mixture usually comprises 10–75% by weight of the total solids.

Particularly preferred as binders are acidic, polymeric, organic compounds since the photopolymerizable composition resulting is developable in an aqueous alkaline solvent devoid of organic solvents. This is advantageous since organic solvents are costly, may be hazardous with respect to toxicity and/or flammability, may become scarce due to petrochemical shortages, and may pollute the air and water.

One class of film-forming binders which is soluble in aqueous alkaline media and is useful in the compositions of the present invention is made up of vinyl addition polymers containing free carboxylic acid groups, which are prepared from 30 to 94 mole percent of one or more alkyl acrylates and 70 to 6 mole percent of one or more alpha-beta-ethylenically unsaturated carboxylic acids, and more preferably prepared from 61 to 94 mole percent of two alkyl acrylates and 39 to 6 mole percent of an alpha-beta-ethylenically unsaturated carboxylic acid. Suitable alkyl acrylates for use in preparing these polymeric binders include methyl acrylate, ethyl, acrylate, propyl acrylate, butyl acrylate, methyl methacrylate, ethyl methacrylate, butyl methacrylate, etc. Suitable alpha-beta-ethylenically unsaturated carboxylic acids include acrylic acid, methacrylic acid and the like. Binders of this type, including their preparation, are described in German OLS No. 2,320,849 (published 1973).

The advantages of using acidic binders can also be obtained by selecting a preformed, compatible macromolecular polymeric binding agent which is a copolymer of (1) a styrene-type of a vinyl monomer and (2) an unsaturated carboxy-containing monomer, as described in detail in British Pat. No. 1,361,298.

Another preferred photopolymerizable composition is obtained by using a preformed, compatible macromolecular polymeric binding agent mixture, the components thereof taken from two selected classes. The use of the mixtures as described in British Pat. No. 1,507,704, eliminates the need for organic solvents in developing. These are mixtures of two types of binders. The first type is preferably selected from a copolymer of vinyl acetate and crotonic acid; a terpolymer of ethyl acrylate, methyl methacrylate, and acrylic acid; and cellulose acetate succinate. The second type is preferably selected from toluene sulfonamide formaldehyde; a copolymer of methyl methacrylate and methacrylic acid; a terpolymer of methyl methacrylate, ethyl acrylate, and hydrogen maleate; a terpolymer of vinyl chloride, vinyl acetate, and maleic acid; a copolymer of styrene and maleic anhydride; and a terpolymer of methyl methacrylate, ethyl acrylate, and methacrylic acid.

The nonphotosensitive layer may be coated on the support from an appropriate solvent (e.g. water). After drying, the photopolymerizable layer is applied from its appropriate solvent. A cover sheet, e.g., a thin polyethylene terephthalate sheet sold as MYLAR polyester, a trademark of E. I. du Pont de Nemours and Company, is usually laminated over the photopolymerizable layer. These steps are all conventional in the art.

This invention will now be illustrated by the following examples of which Example 1 is considered to be the best mode:

EXAMPLE 1

The following solution is prepared, to make up what the drawings identify as layer 2 of this invention:

| Ingredient | Amt. (g.) |
| --- | --- |
| Distilled Water | 130 |
| Gelatin | 2.5 |
| Glutaraldehyde-Sodium Bisulfite | 0.55 |
| Carbon Black (Helioechtschwartz VM)[1] | 12.2 |

[1]Mobay TM for Pigment Fast Black Carbon Black (35%), polyoxyethylene stearyl ether nonionic surfactant (14%), sodium alkylaryl sulfonate surfactant (10%), methylpentane diol (25%), and water (25%).

This is coated on 4.2 mil clear polyethylene terephthalate film base (1) which had been coated in a conventional manner with a standard vinylidene chloride, ethyl acrylate, methylmethacrylate sub over which a thin substratum of gelatin had also been coated. A 2-mil doctor knife is used to prepare this coating.

The following solution is prepared to make up what the drawings identify as photopolymerizable layer 3 of this invention:

| Ingredient | Amt. (g.) |
| --- | --- |
| Methylene chloride | 100.0 |
| Polyoxyethylated trimethylolpropane triacrylate (TEOTA) | 4.0 |
| Michler's ketone, 4,4'-bis(dimethylamino)-benzophenone | 0.5 |
| 2-o-chlorophenyl-4,5-di-(M-methoxyphenyl) imidazolyl dimer (CMD-HABI) | 1.0 |
| SMA-17352A - copolymer of styrene and maleic anhydride esterified with isopropyl alcohol (M. W. 1700, acid number 270) - Arco Chem. Co. | 4.0 |
| CARBOSET XL-11, an alkali-soluble acrylic resin, (M. W. 40,000, acid number 70, Tg 50-55° C.) - Goodrich Chem. Co. | 4.0 |
| FC-430 - a fluorochemical nonionic surfactant, 3M Co. | 0.2 |

This is coated on top of layer 2 made above, using a 2-mil doctor knife. A thin (ca. 0.005 inch) Mylar polyester cover sheet is laminated thereon to protect this element and to prevent oxygen inhibition.

This composite product is exposed through the cover sheet and a negative test image for about 10 seconds to a 4 kw xenon light source at a distance of 60 inches. The cover sheet is then stripped from the exposed element and processed in a solution comprising 840 g. $K_2CO$ and 50 g. $KHCO_3$ in 16 liters of distilled water. The developing solution diffuses rapidly through the nonimaged areas of the photopolymer film 3 into the corresponding areas of the black, nonphotosensitive layer 2 underneath. The glutaraldehyde is released in these areas, causing the gelatin to crosslink and harden. By rinsing in warm water and by gently scrubbing with a soft material or gauze the photopolymer layer 3 is removed in toto, along with the unhardened portions of the black, nonphotosensitive layer 2. A high quality positive image of the test image remains. This final image has a density greater than 3.0 and excellent 5-95% dot fidelity.

EXAMPLE 2

The following solution is prepared to make a photopolymerizable composition:

| Ingredient | Amt. (g.) | |
| --- | --- | --- |
| Methylene chloride | 100.0 | |
| Methanol | 5.0 | |
| CARBOSET XL-11 (See Ex. 1) | 4.0 | |
| SMA-17352A (See Ex. 1) | 4.0 | |
| Water | 1.0 | Mix before charging to overall mixture |
| Potassium Hydroxide | 0.5 | |
| Methanol | 9.0 | |
| CMD-HABI (See Ex. 1) | 1.0 | |
| Michler's ketone (See Ex. 1) | 0.5 | |
| Trimethylolpropane Triacrylate (TMPTA) | 4.0 | |
| FC-430 (See Ex. 1) | 0.2 | |

This composition is coated on sample layer 2 made according to the instructions of Example 1 which had been coated on a polyethylene terephthalate film support as taught therein. A Mylar polyester cover sheet is then laminated over the photopolymerizable layer and an exposure similar to that described in Example 1 is given to this element. The cover is then removed and the image developed as in Example 1. A high quality, direct positive image is obtained with excellent density and dot quality. This example demonstrates the use of yet another photopolymerizable layer in conjunction with the nonphotosensitive, hardenable layer of this invention.

EXAMPLE 3

The following solution is prepared to make up what the drawings identify as layer 2 of this invention:

| Ingredient | Amt. (g) |
| --- | --- |
| Dist. Water | 65 |
| Gelatin | 1.25 |
| $NaHSO_3$ | 0.1 |
| Glyoxal-sodium bisulfite | 0.275 |
| Helioechtschwartz Carbon Black (See Ex. 1) | 6 |

This composition is coated on a film support and overcoated with the photopolymerizable composition of Example 1. A cover layer is applied and the element is exposed and developed as described in Example 1. An excellent, positive image is obtained which indicates that glyoxal-sodium bisulfite can be used as the releasable hardener in this invention.

EXAMPLE 4

The following solution is prepared to make up of an alternate layer 2 of this invention:

| Ingredient | Amt. (g.) |
| --- | --- |
| Distilled Water | 100 |
| Polyvinyl alcohol (Vinol ® 107, a fully hydrolysed, low vis. PVA, Air Products & Chem. Co., Inc.) | 5 |
| Boric Acid | 0.5 |
| Helioechtschwartz Carbon Black (See Ex. 1) | 6 |

This is coated on a support, overcoated with a photopolymerizable layer, laminated with a cover sheet, exposed and developed as described in Example 1. A fine, high quality direct positive image is obtained which demonstrates that polyvinyl alcohol binder and boric acid as the releasable hardener can be used within the metes and bonds of this invention.

EXAMPLE 5

The following solution is prepared to make up another alternate layer 2 of this invention:

| Ingredient | Amt. (g.) |
| --- | --- |
| Distilled Water | 65 |
| Gelatin | 1.25 |
| Glutaraldehyde-sodium Bisulfite | 0.24 |
| Acid Violet Dye (4 VNS, Extra Conc., Sandoz Chem. Co.) | 0.40 |

This material is coated on a polyethylene terephthalate film support as described in Example 1.

The following solution is prepared to make up a photopolymerizable composition:

| Ingredient | Amt. (g.) | |
| --- | --- | --- |
| Methylene chloride | 100 | |
| Methanol | 5 | |
| CARBOSET XL-11 (See Ex. 1) | 4 | |
| Water | 1 | Mix before charging overall mixture |
| KOH | 0.5 | |
| Methanol | 9 | |
| CMD-HABI (See Ex. 1) | 1 | |
| Michler's ketone (See Ex. 1) | 0.5 | |
| TMPTA (See Ex. 2) | 2 | |
| TEOTA (See Ex. 1) | 2 | |
| FC-430 (See Ex. 1) | 10 | drops |

This composition is overcoated on layer 2 made above, using a 2 mil doctor knife, and dried. A polyethylene terephthalate cover sheet is laminated over this structure. The photopolymer element is exposed and developed as described in Example 1. A high quality, dark violet, direct positive image is obtained.

EXAMPLE 6

The following solution is prepared to make up another layer 2 of this invention:

| Ingredient | Amt. (g.) |
| --- | --- |
| Distilled Water | 130 |
| Gelatin | 2.5 |
| Glyoxal-sodium Bisulfite | 0.52 |
| Dalamar Yellow (C. I. Pigment Yellow 74, 20% Disp. in H$_2$O) | 12.0 |

This composition is coated on a copper surface of a copper/epoxy laminate board and dried. The photopolymerizable composition from Example 5 is applied over this layer, dried and a conventional cover sheet applied thereon. The composition element is exposed and developed as described in Example 1. A yellow positive image on the copper layer is obtained. The image is then etched with 39° Baume ferric chloride at 130° F. to remove the copper in the nonimage area, showing that properly used, this element will function as a photoresist.

EXAMPLE 7

The following solution is prepared to make up another layer 2 of this invention:

| Ingredient | Amt. (g.) |
| --- | --- |
| Distilled Water | 65 |
| Gelatin | 1.25 |
| Propylene glycol alginate releasable hardener[1] | 0.3 |
| Helioechtschwartz Carbon Black (See Ex. 1) | 6 |

[1] propylene glycol ester of alginic acid

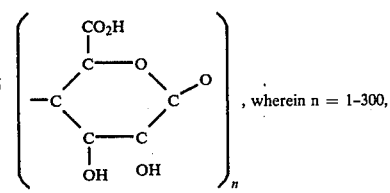

, wherein n = 1–300, sold as KELCOLOID-O, a trademark of Kelco Co. (When this material hydrolyses at pH 7 or greater, the products will rapidly harden gelatin - see U.S. Pat. No. 3,378,373.)

This material is coated on a support as described in Example 1 and dried. A photopolymerizable layer made as described in Example 1 is coated over this layer, dried and a conventional cover sheet applied thereon. This composite structure is exposed and developed as described in Example 1. An excellent, high quality direct positive image with good density and dot quality is achieved. In an alternate developing method, another sample of the composite described in this example is exposed and simply processed by dipping for 25 seconds in a 1% KOH solution at 75° F. and rinsed under 100° F. water. The resulting product was a superior direct positive image with high density and excellent dot quality.

EXAMPLE 8

The following solution is prepared to make up another layer 2 of this invention:

Mix 10 g. of hydroxyethyl cellulose (CELLOSIZE WP-09-H, trademark of Union Carbide Co.) in 400 g. H$_2$O in a blender for 40 mins.

| Ingredient | Amt. (g.) |
| --- | --- |
| Solution from above | 20 |
| Glutaraldehyde Sodium Bisulfite | 0.2 |
| Helioechtschwartz Carbon Black (See Ex. 1) | 5 |

This material is coated on a suitable support as described in Example 1. A photopolymerizable layer made according to Example 1 is applied over this dried layer and a conventional cover sheet laminated thereon. The composite product is exposed as described in Example 1 and developed by washing in 5% alcoholic KOH at 75° F. and 100° F. water washing. A suitable direct positive image is obtained.

EXAMPLE 9

The following solution is prepared to make layer 2 of this invention: Mix 2.5 g. carboxymethyl hydroxyethyl cellulose (Hercules Chem. Corp. type 37M) in 100 g. $H_2O$ in a blender for 40 mins.

| Ingredient | Amt. (g.) |
| --- | --- |
| Solution from above | 20 |
| Glyoxal Sodium Bisulfite | 0.2 |
| Helioechtschwartz Carbon Black (See Ex. 1) | 5 |

This material is coated on a support, dried, a photopolymerizable layer applied thereon, followed by drying and lamination of a cover sheet all as described in Example 1. The composite product is exposed as described in Example 1 followed by development in 5% alcoholic KOH and water washing at 100° F. A suitable direct positive image is obtained.

EXAMPLE 10

The following solution is prepared to make up a layer 2 of this invention: Mix 2.5 g. carboxymethyl cellulose, sodium salt (Du Pont Co., Grade R-755-H) in 200 g. $H_2O$-pH 6.4

| Ingredient | Amt. (g.) |
| --- | --- |
| Solution from above | 20 |
| N,N'—methylenebisacrylamide releasable hardener | 0.1 |
| Helioechtschwartz Carbon Black (See Ex. 1) | 4 |

This is coated on a support, dried, overcoated with photopolymerizable composition, dried, and a cover sheet laminated thereto as described in Example 1. The composite product is exposed as described in Example 1 and developed by 5% alcoholic KOH (2 mins. at 75° F.) and water washing in 100° F. water. A suitable direct positive image is obtained.

EXAMPLE 11

The following solution is prepared to make up a layer 2 of this invention:

| Ingredient | Amt. (g.) |
| --- | --- |
| Solution from Ex. 10 | 20 |
| Aqueous soln. containing 0.1 g. CrK $(SO_4)_2$.12 $H_2O$ + 0.1 g. 0.2N $H_2SO_4$ | 10 |
| Helioechtschwartz Carbon Black | 4 |

This is coated on a support, dried, overcoated with photopolymerizable solution, dried, and a cover sheet laminated thereto as described in Example 1. The composite product is exposed as described in Example 1 and developed by 5% alcoholic KOH at 75° F. followed by washing in water at 100° F. A suitable direct positive image is obtained.

I claim:

1. A positive-working photopolymer element consisting essentially of a support, on one side of which is coated, in order, (1) a nonphotosensitive layer comprising a gelatin binder, a colorant selected from the group consisting of pigments and dyes, and a sodium bisulfite adduct of a gelatin hardening agent of the group consisting of glutaraldehyde, glyoxal, formaldehyde, and starch dialdehyde and (2) a photopolymerizable layer comprising a photoinitiator, an actinic radiation absorber, a photopolymerizable monomer, and a polymeric binder.

2. The photopolymer element of claim 1 wherein the nonphotosensitive layer (1) is opaque and the colorant is carbon black.

3. The photopolymer element of claim 1 wherein the support is a polyethylene terephthalate film.

4. The photopolymer element of claim 1 wherein the photopolymerizable layer (2) comprises a photoinitiator, an actinic radiation absorber, a photopolymerizable monomer, and a polymeric binder.

5. The photopolymer element of claim 1 wherein the photopolymerizable monomer is a member selected from the group consisting of triethyleneglycol dimethacrylate (TDMA), and polyoxyethylated trimethylolpropane triacrylate (TEOTA).

* * * * *